United States Patent
Park et al.

(10) Patent No.: US 9,680,455 B2
(45) Date of Patent: Jun. 13, 2017

(54) CLAMPING CIRCUIT, POWER SUPPLY DEVICE INCLUDING THE SAME AND DRIVING METHOD OF POWER SUPPLY DEVICE

(71) Applicant: FAIRCHILD KOREA SEMICONDUCTOR LTD., Bucheon-si (KR)

(72) Inventors: In-Ki Park, Seoul (KR); Hyun-Chul Eum, Seoul (KR); Chi-Yin Lo, Kaoshiung (TW)

(73) Assignee: Fairchild Korea Semiconductor Ltd., Bucheon (KR)

( * ) Notice: Subject to any disclaimer, the term of this patent is extended or adjusted under 35 U.S.C. 154(b) by 36 days.

(21) Appl. No.: 14/557,880

(22) Filed: Dec. 2, 2014

(65) Prior Publication Data

US 2015/0155860 A1    Jun. 4, 2015

(30) Foreign Application Priority Data

Dec. 2, 2013    (KR) .................. 10-2013-0148822

(51) Int. Cl.

| H02M 1/42 | (2007.01) |
|---|---|
| H03K 5/08 | (2006.01) |
| H03K 5/1532 | (2006.01) |
| H03K 5/1252 | (2006.01) |
| H02M 1/36 | (2007.01) |
| H02M 1/00 | (2006.01) |

(52) U.S. Cl.
CPC .............. *H03K 5/08* (2013.01); *H02M 1/36* (2013.01); *H02M 1/4258* (2013.01); *H03K 5/1252* (2013.01); *H03K 5/1532* (2013.01); *H02M 2001/0022* (2013.01); *H02M 2001/0025* (2013.01); *Y02B 70/126* (2013.01)

(58) Field of Classification Search
CPC ............. H02M 3/335; H02M 3/33507; H02M 3/33515; H02M 3/33523; H02M 3/33538; H02M 3/33546; H02M 3/33553; H02M 1/36; H02M 1/34; H02M 2001/342; H02M 2001/344
See application file for complete search history.

(56) References Cited

U.S. PATENT DOCUMENTS

| 6,316,993 | B1 * | 11/2001 | Hellums | ................ H03F 1/305 330/149 |
|---|---|---|---|---|
| 7,518,348 | B1 * | 4/2009 | Kobayashi | ............ H02M 3/156 323/222 |
| 2002/0163821 | A1 * | 11/2002 | Odell | ...................... H02M 1/34 363/56.11 |
| 2010/0164462 | A1 * | 7/2010 | Yen | ........................ H02M 3/156 323/288 |
| 2010/0253309 | A1 * | 10/2010 | Xi | .......................... H02M 3/156 323/288 |
| 2011/0115456 | A1 * | 5/2011 | Tanifuji | ................. H02M 3/156 323/283 |

(Continued)

*Primary Examiner* — Jeffrey Gblende

(57) ABSTRACT

A power supply includes a power switch and a switch control circuit controlling a switching operation of the power switch using a comparison voltage generated according to an output, determining a clamping voltage by sensing an input voltage during a start-up period, and clamping the comparison voltage to the clamping voltage during the start-up period.

12 Claims, 4 Drawing Sheets

(56) References Cited

U.S. PATENT DOCUMENTS

2012/0086423 A1\* 4/2012 Dao ................. H02M 1/36
                                            323/285
2014/0160801 A1\* 6/2014 Stamm ............ H05B 33/0815
                                            363/21.01

\* cited by examiner

CLAMPING CIRCUIT, POWER SUPPLY DEVICE INCLUDING THE SAME AND DRIVING METHOD OF POWER SUPPLY DEVICE

CROSS-REFERENCE TO RELATED APPLICATION

This application claims priority to and the benefit of Korean Patent Application No. 10-2013-0148822 filed in the Korean Intellectual Property Office on Dec. 2, 2013, the entire contents of which are incorporated herein by reference.

BACKGROUND (a) Field

An exemplary embodiment relates to a clamping circuit that can prevent overshoot, a power supply including the clamping circuit, and a driving method of the power supply.

(b) Description of the Related Art

In order to regulate an output of a power supply, a predetermined comparison voltage corresponding to output information is generated. In this case, a capacitor is used to generate the comparison voltage, and capacity of the capacitor may be increased to acquire a higher power factor.

In order to quickly increase an output voltage during a start-up period, the comparison voltage should be quickly increased. If the comparison voltage cannot be quickly increased during the start-up period, start-up may fail or the start-up period may be extended.

In a normal state after termination of the start-up period, a level of the comparison voltage is changed according to an input voltage. When a comparison voltage at a termination time of the start-up period is higher than a comparison voltage in the normal state, overshoot of an output current occurs.

The above information disclosed in this Background section is only for enhancement of understanding of the background of the invention and therefore it may contain information that does not form the prior art that is already known in this country to a person of ordinary skill in the art.

SUMMARY

The invention has been made in an effort to provide a clamping circuit that can prevent overshoot, a power supply including the clamping circuit, and a driving method of the power supply.

A power supply according to an exemplary embodiment of the invention includes a power switch and a switch control circuit controlling a switching operation of the power switch using a comparison voltage generated according to an output, determining a clamping voltage by sensing an input voltage during a start-up period, and clamping the comparison voltage to the clamping voltage during the start-up period.

The switch control circuit detects a peak voltage of the sensed input voltage, and determines the clamping voltage in an inverse relationship with the peak voltage.

The power supply further includes a primary wire receiving the input voltage and an auxiliary wire coupled electromagnetically with the primary wire, wherein the switch control circuit senses the input voltage using an auxiliary voltage of the auxiliary wire during an input voltage detection period in the start-up period.

The switch control circuit generates an input sense voltage corresponding to the sensed input voltage using a current supplied for clamping a voltage which is resistance-divided from the auxiliary voltage to a predetermined voltage, and determines the peak voltage by detecting a peak of the input sense voltage.

The switch control circuit further includes an operational amplifier generating the comparison voltage using a first source current during the start-up period and a first source current source supplying the first source current.

The first source current source supplies the first source current to the operational amplifier during a remaining period, excluding an input voltage detection period in the start-up period, and supplies the first source current to the operational amplifier during an increasing period in the input voltage detection period.

The switch control circuit further includes a second source current supplying a second source current to the operational amplifier in a normal state after termination of the start-up period.

An exemplary embodiment of the invention relates to a driving method of a power supply including a primary wire connected to an input voltage and a power switch connected to the primary wire. The driving method of the power supply includes: controlling a switching operation of the power switch using a comparison voltage generated according to an output; determining a clamping voltage by sensing the input voltage during a start-up period; and clamping the comparison voltage to the clamping voltage during the start-up period.

The determining the clamping voltage includes: sensing the input voltage; detecting a peak voltage of the sensed input voltage; and determining the clamping voltage in an inverse relationship with the peak voltage.

The power supply further includes an auxiliary wire coupled with the primary wire, and the sensing the input voltage includes generating an input sense voltage corresponding to the sensed input voltage using a current supplied to clamp a voltage which is resistance-divided from an auxiliary voltage of the auxiliary wire to a predetermined voltage during an input voltage detection period in the start-up period.

The detecting the peak voltage includes determining the peak voltage by detecting a peak of the input sense voltage.

The driving method of the power supply further includes generating the comparison voltage using a first source current during the start-up period.

The generating the comparison voltage includes supplying the first source current to a capacitor during a remaining period, excluding the input voltage detection period in the start-up period, and supplying the first source current to the capacitor during an increasing period in the input voltage detection period.

A clamping circuit for clamping a comparison voltage determined according to an output of a power supply according to an exemplary embodiment includes: an input voltage detector sensing an input voltage of the power supply and detecting a peak voltage of the sensed input voltage; and a clamping voltage generator determining a clamping voltage in an inverse relationship with the peak voltage and generating the clamping voltage. The clamping circuit clamps the comparison voltage to the clamping voltage during a start-up period.

The input voltage detector senses the input voltage using an auxiliary voltage of an auxiliary wire coupled electromagnetically with a primary wire of the power supply during the start-up period.

The input voltage detector generates an input sense voltage corresponding to the sensed input voltage using a current supplied for clamping a voltage which is resistance-divided from the auxiliary voltage to a predetermined voltage, and determining the peak voltage by detecting a peak of the input sense voltage.

The clamping circuit further includes a connection switch being turned on during the start-up period and a clamper connected to the comparison voltage through the connection switch during the start-up period, and clamping the comparison voltage to the clamping voltage.

According to the exemplary embodiments, a clamping circuit that can prevent overshoot, a power supply including the clamping circuit, and a driving method of the power supply can be provided.

DETAILED DESCRIPTION OF THE EMBODIMENTS

Figure 1:
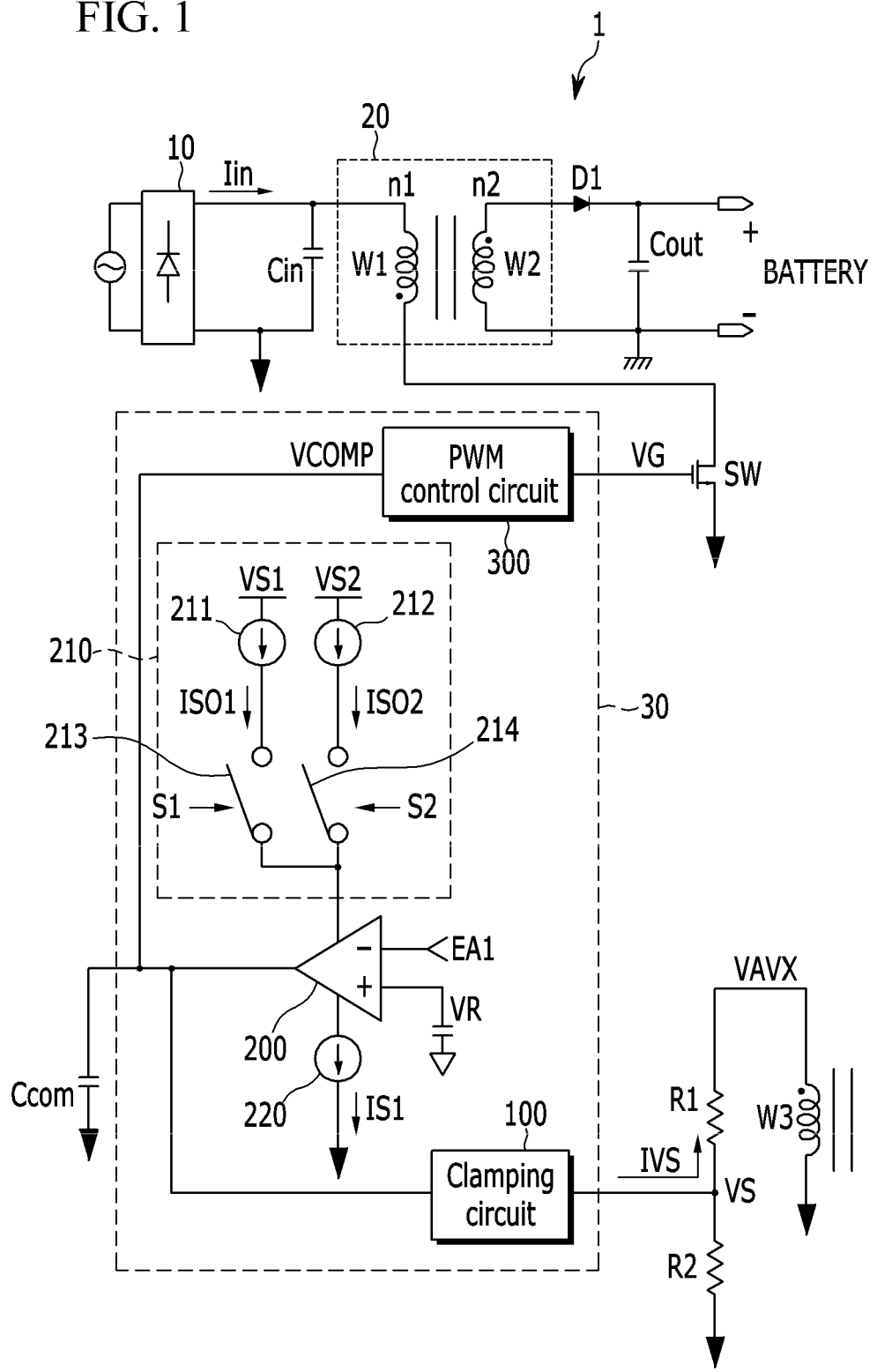
FIG. 1 shows a power supply including a clamping circuit according to an exemplary embodiment.

In the following detailed description, only certain exemplary embodiments of the invention have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a power supply including a clamping circuit according to an exemplary embodiment.

As shown in FIG. 1, a power supply 1 includes a rectification circuit 10, a capacitor Cin, a transformer 20, a rectification diode D1, an output capacitor Cout, a power switch SW, and a switch control circuit 30.

The power supply of FIG. 1 is realized as a flyback converter, but the exemplary embodiment is not limited thereto.

Lateral output ends of the power supply 1 are connected to a load (not shown), and the load may be exemplarily provided as a plurality of serially connected LEDs.

An AC input AC is rectified through the rectification circuit 10, and the rectified AC input is filtered through the capacitor C1.

The rectification circuit 10 may be a full-bridge diode, which is a full-wave rectification circuit.

The transformer 20 includes a primary wire W1 connected to an input voltage Vin and a secondary wire W2 connected to an output voltage Vout. The primary wire W1 and the secondary wire W2 are coupled in an insulated manner with a predetermined turn ratio (turns of primary wire CO1 to turns of secondary wire CO2).

A first end of the primary wire W1 is connected to the input voltage Vin, and a second end of the primary wire W1 is connected to a first electrode (i.e., a drain) of the power switch SW. Energy generated by an input current Iin is stored in the primary wire W1 during a turn-on period of the power switch SW.

A first end of the secondary wire W2 is connected to an anode of the rectification diode D1 and a second end of the secondary wire W2 is connected to a secondary ground. During a turn-off period of the power switch SW, the energy stored in the primary wire W1 is transmitted to the secondary wire W2.

The power switch SW is electrically connected to the input voltage Vin, and controls output power of the power supply 1. A gate of the power switch SW is connected with a gate voltage VG supplied from the switch control circuit 30, and a second electrode (i.e., a source) of the power switch SW is connected to a primary ground. The power switch SW is turned on by a high-level gate voltage VG and turned off by a low-level gate voltage VG.

The output capacitor Cout is connected between lateral output ends of the power supply 1. A first electrode of the output capacitor Cout is connected to a cathode of the rectification diode D1, and a second electrode of the output capacitor Cout is connected to the secondary ground.

A current flowing to the secondary wire W1 passes through the rectification diode D1. The current passed through the rectification diode D1 is applied to a load (not shown), and the output voltage Vout is smoothened by the output capacitor Cout.

The switch control circuit 30 generates a gate voltage VG that controls a switching operation of the power switch SW according to the comparison voltage VCOMP, senses the input voltage Vin, determines a clamping voltage VCLAMP of the comparison voltage VCOMP according to the sensed input voltage Vin, and clamps a comparison voltage VCOMP of a start-up period to the clamping voltage VCLAMP.

During the start-up period from an operation start time of the power supply 1, the switch control circuit 30 quickly increases the comparison voltage VCOMP. During the start-up period, the switch control circuit 30 clamps the increasing comparison voltage VCOMP to the clamping voltage VCLAMP. During a predetermined period (hereinafter, an input voltage detection period) in the start-up period, the switch control circuit 30 determines the clamping voltage VCLAMP using the sensed input voltage Vin.

In a normal state after termination of the start-up period, the switch control circuit 30 generates the comparison voltage VCOMP according to information on the output current, and does not clamp the comparison voltage VCOMP to the clamping voltage VCLAMP.

The switch control circuit 30 includes a clamping circuit 100, an operational amplifier 200, and a PWM control circuit 300.

The clamping circuit 100 senses the input voltage during the input voltage detection period, and determines and generates the clamping voltage VCLAMP according to a peak voltage of the input voltage Vin sensed during the input voltage detection period. The clamping circuit 100 is not operated after being operated for a predetermined period from the operation start time of the power supply 1. For example, the clamping circuit 100 operates during the start-up period, and is connected to a capacitor Ccom where the comparison voltage VCOMP is generated during the start-up period to clamp the comparison voltage VCOMP to the clamping voltage VCLAMP.

The operational amplifier 200 controls the comparison voltage VCOMP according to an error signal EA1 that indicates information on an output and a predetermined reference voltage VR. The error signal EA1 is input to an inversion terminal (−) of the operational amplifier 200 and the reference voltage VR is input to a non-inversion terminal (+) of the operational amplifier 200, and an output end of the operational amplifier 200 is connected to the capacitor Ccom.

The operational amplifier 200 supplies a source current (e.g., ISO1) supplied from a source current source 210 to the capacitor Ccom during the start-up period to increase the comparison voltage VCOMP.

For example, the operational amplifier 200 may supply the source current ISO1 to the capacitor Ccom during a period excluding the input voltage detection period in the start-up period, and may increase the comparison voltage VCOMP by supplying the source current ISO1 only during a predetermined increasing period in the input voltage detection period. In a remaining period, excluding the increasing period in the input voltage detection period, the operational amplifier 200 may block supply of the source current to the capacitor Ccom. Then, the comparison voltage VCOMP may be maintained with a constant level in the remaining period.

In the normal state, the operational amplifier 200 supplies a source current (e.g., ISO2) supplied from the source current source 210, or flows a current sunk by a sink current source 220 to the ground from the capacitor Ccom according to a difference between the error signal EA1 and the reference voltage VR.

During the start-up period, the source current ISO1 supplied from the source current source 210 is greater than the source current ISO2 supplied from the source current source 210. For example, the source ISO1 may be more than 10 times the source current ISO2.

Since the error signal EA1 is hardly generated during the start-up period, the capacitor Ccom is quickly charged by the source current ISO1 output from the operational amplifier 200 according to the exemplary embodiment.

In the normal state, the error signal EA1 is fluctuated according to an output, and the comparison voltage VCOMP is generated in a direction (i.e., negative feedback) that the difference between the error signal EA1 and the reference voltage VR is decreased. For example, the output is increased, and thus the error signal EA1 is increased and the comparison voltage VCOMP is decreased. When the comparison voltage VCOMP is decreased, a duty of the power switch SW is decreased and thus the output is decreased. On the contrary, when the output is decreased and thus the error signal EA1 is decreased, the comparison voltage VCOMP is increased. When the comparison voltage VCOMP is increased, the duty of the power switch SW is increased and thus the output is increased.

The source current source 210 includes a first source current source 211, a second source current source 212, a first switch 213, and a second switch 214.

The first source current source 211 generates the source current ISO1 using a voltage VS1. The first switch 213 is connected between the first source current source 211 and the operational amplifier 200. The first switch 213 performs a switching operation according to a first switching signal S1, and may be turned on when the first switching signal S1 is at an enable level during the start-up period. The first switching signal S1 may have the enable level a period excluding the input voltage detection period in the start-up period and a predetermined increasing period in the input voltage detection period.

The second source current source 212 generates the source current ISO2 using a voltage VS2. The second switch 214 is connected between the second source current source 212 and the operational amplifier 200. The second switch 214 performs a switching operation according to the second switching signal S2, and may be turned on by an enable-level second switching signal S2 in the normal state.

The sink current source 220 is connected between the operational amplifier 200 and the primary ground, and generates a sink current 151 flowing to the ground.

The PWM controller 300 may turn on the power switch SW by being synchronized with an oscillator signal that determines a switching frequency, and may turn off the power switch SW when a voltage corresponding to a current flowing to the power switch SW reaches the comparison voltage VCOMP.

Hereinafter, the clamping circuit 100 according to the exemplary embodiment will be described with reference to FIG. 2 and FIG. 3.

Figure 2:
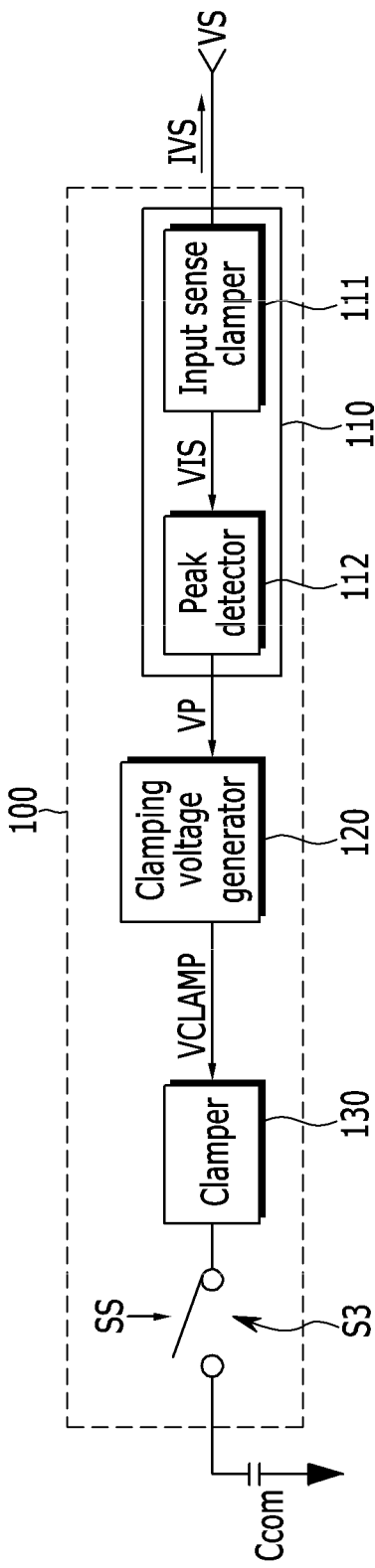
FIG. 2 shows the clamping circuit according to the exemplary embodiment.

FIG. 2 shows the clamping circuit according to the exemplary embodiment.

Figure 3:
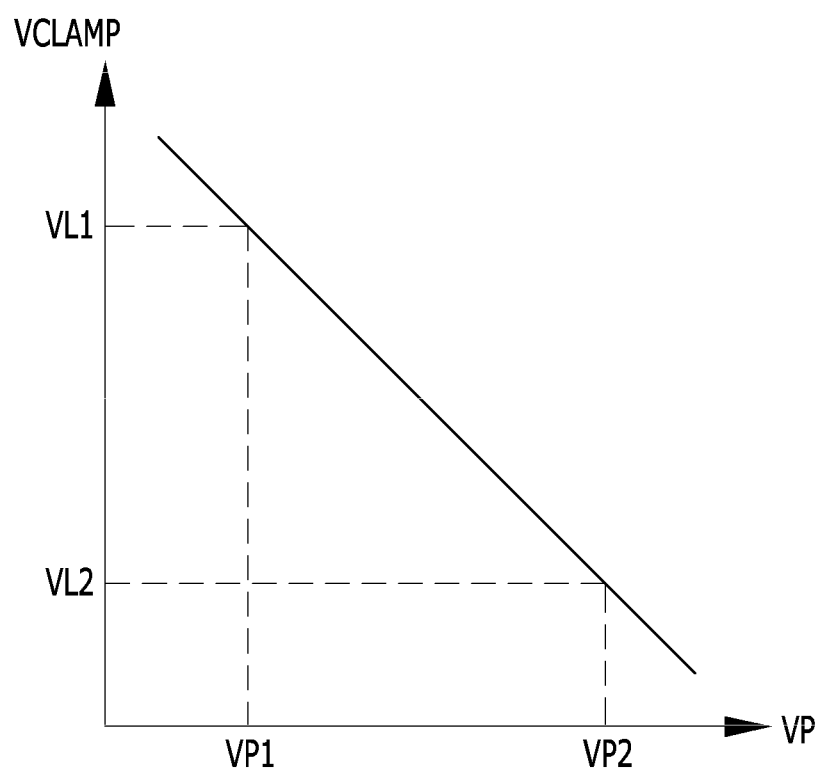
FIG. 3 is a graph illustrating a relationship between a peak voltage according to an input voltage and a clamping voltage according to the exemplary embodiment.

FIG. 3 is a graph illustrating a relationship between the peak voltage according to the input voltage and the clamping voltage according to the exemplary embodiment.

The clamping circuit 100 according to the exemplary embodiment may use an auxiliary wire W3 to detect the input voltage Vin. The auxiliary wire W3 is provided in the primary side of the power supply 1 shown in FIG. 1, and is electromagnetically coupled with the primary wire W1 with a predetermined turn ratio (n1:n3). Hereinafter, for convenience of description, the turn ratio between the primary wire W1 and the auxiliary wire W3 is set to 1:1.

During a turn-on period of the power switch SW, a voltage (hereinafter, an auxiliary voltage VAUX) between lateral ends of the primary wire W1 is the input voltage Vin. A polarity of the auxiliary voltage VAUX of the auxiliary wire W3 is opposite to a polarity of the voltage between lateral ends of the primary wire W1, and therefore the auxiliary voltage of the auxiliary wire W3 is −Vin during the turn-on period of the power switch SW.

During a turn-off period of the power switch SW, the voltage between lateral ends of the primary wire W1 is a negative voltage that is proportional to the output voltage VOUT and the auxiliary voltage VAUX is a positive voltage that is proportional to the output voltage VOUT.

The clamping circuit 100 may sense the input voltage Vin using a voltage sense current IVS supplied to the auxiliary wire W3 during the turn-on period of the power switch SW.

The clamping circuit 100 includes an input voltage detector 110, a clamping voltage generator 120, a clamper 130, and a connection switch S3. Two resistors R1 and R2 are connected in series between a first end of the auxiliary wire W3 and the primary ground, and a second end of the auxiliary wire W3 is connected to the primary ground.

The input voltage detector 110 generates the voltage sense current IVS according to the auxiliary voltage VAUX generated during the turn-on period of the power switch SW, generates the input sense voltage VIS that corresponds to the input voltage Vin according to the intensity of the voltage sense current IVS, and detects a peak voltage VP of the input sense voltage VIS in the input voltage detection period.

The input voltage detector 110 includes an input sense clamper 111 and a peak detector 112. The input sense clamper 111 generates the voltage sense current IVS to clamp a voltage VS to a voltage that is higher than a predetermined voltage. When the predetermined voltage is a primary ground voltage, the voltage sense current IVS is Vin/R1 during the turn-on period of the power switch SW. That is, the voltage sense current IVS may be proportional to the input voltage Vin during the turn-on period of the power switch SW. During the turn-off period of the power switch SW, the auxiliary voltage VAUX is higher than the primary ground voltage, and thus the voltage sense voltage IVS does not flow.

The input sense clamper 111 generates the input sense voltage VIS by converting the voltage sense current IVS to a voltage. For example, the input sense clamper 111 mirrors the voltage sense current IVS, and flows the mirror current to a resistor so as to generate the input sense voltage VIS.

The peak detector 112 receives the input sense voltage VIS, and detects the peak voltage VP of the input sense voltage VIS during the input voltage detection period. The input voltage detection period is set in consideration of a frequency of the input voltage Vin, and may be set to be a period that is longer than at least one period of the input voltage Vin.

The clamping voltage generator 120 determines the clamping voltage VCLAMP corresponding to the peak voltage VP, and generates the clamping voltage VCLAMP. In this case, a relationship between the peak voltage VP and the clamping voltage VCLAMP may be an inverse relationship as shown in FIG. 3. Since the peak voltage VP is a peak of the sensed input voltage Vin, the relationship graph shown in FIG. 3 may show a relationship between the input voltage Vin and the clamping voltage VCLAMP.

A comparison voltage VCOMP of the start-up period can be controlled to be lower than a comparison voltage VCOMP in the normal state by setting the claiming voltage VCLAMP to be low when the input voltage Vin is high. Then, an overshoot current occurring after termination of the start-up period can be prevented.

The clamper 130 is connected to the capacitor Ccom through the connection switch S3, and clamps the comparison voltage VCOMP to the clamping voltage VCLAMP. The connection switch S3 is turned on by an enable-level switching signal SS during the start-up period. Thus, the comparison voltage VCOMP is clamped to the clamping voltage VCLAMP only during the start-up period.

In FIG. 3, when a level of the peak voltage VP is VP2, a level of the clamping voltage VCLAMP is VL2, and when the level of the peak voltage VP is VP1, the level of the clamping voltage VCLAMP is VL1.

Figure 4:
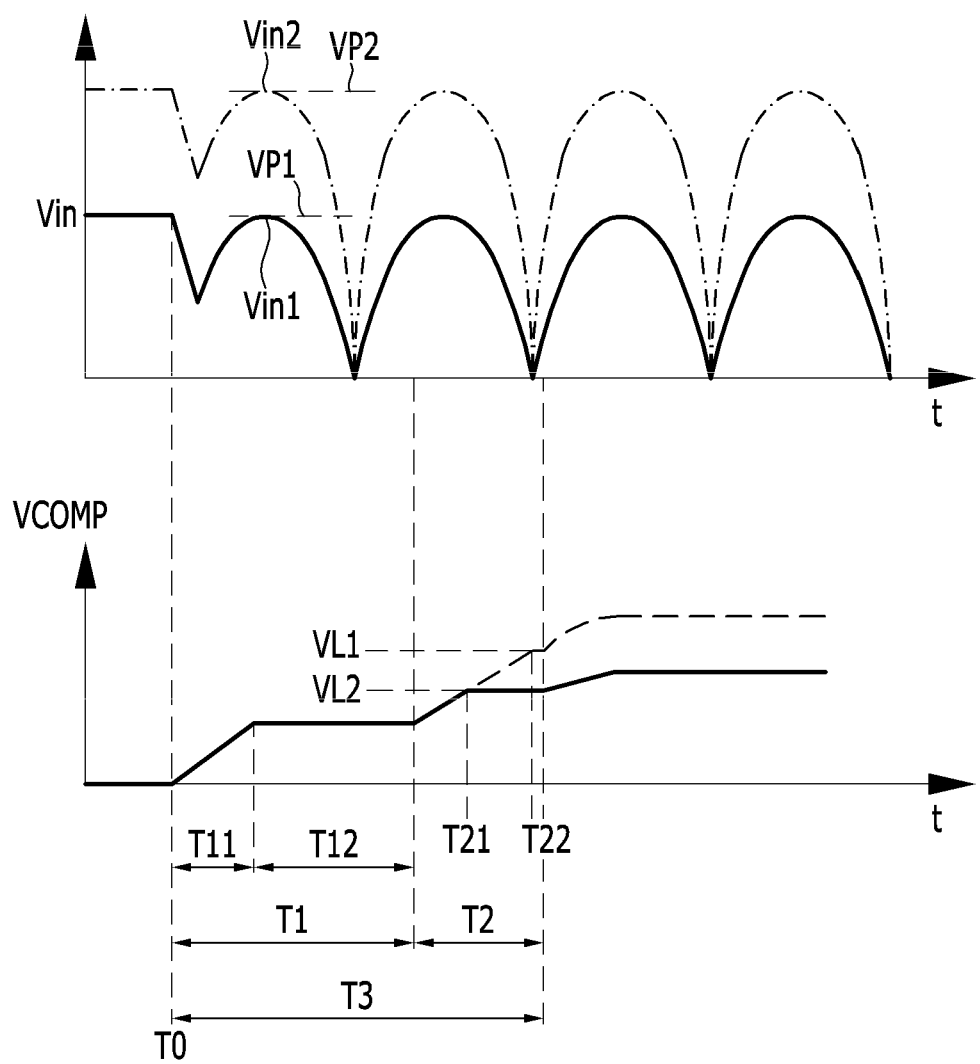
FIG. 4 is a waveform diagram of an input voltage and a comparison voltage according to the exemplary embodiment.

FIG. 4 is a waveform diagram of the input voltage and the comparison voltage according to the exemplary embodiment.

As shown in FIG. 4, when the level of the input voltage Vin is Vin1, the level of the peak voltage VP is VP1 and the level of the clamping voltage VCLAMP is VL1. When the level of the input voltage Vin is Vin2, the level of the peak voltage VP is assumed to be VP2 and the level of the clamping voltage VCLAMP is assumed to be VL2.

The power supply 1 starts operating from T0 such that a switching operation of the power supply 1 starts. The input voltage Vin before T0 depends on the AC voltage passed through the rectification circuit 10.

From T0, the comparison voltage VCOMP is quickly increased compared to the source current ISO1 during an increasing period T11 from T0. The comparison voltage VCOMP is maintained with a constant level during a remaining period T12 in the input voltage detection period T1.

A peak voltage VP1 corresponding to a peak of Vin1 is detected and a peak voltage VP2 corresponding to a peak of Vin2 is detected during the input voltage detection period T1. Since VP2 is higher than VP1, VL1 is higher than VL2.

The input voltage detection period T1 is terminated, and the comparison voltage VOMP is increased by the source current ISO1. When the input voltage Vin is Vin1, the comparison voltage VCOMP reaches the clamping voltage VCLAMP at T22 and is thus clamped to VL1. When the input voltage Vin is Vin2, the comparison voltage VCOMP reaches the clamping voltage VCLAMP at T21 and is thus clamped to VL2.

In the normal state after termination of the start-up period T3, the comparison voltage VCOMP is changed according to an output. In this case, the comparison voltage VCOMP in the start-up period T3 is lower than the comparison voltage VCOMP in the normal state, and therefore overshoot does not occur.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1
rectification circuit 10
capacitor Cin
transformer 20
rectification diode D1
output capacitor Cout
power switch SW
switch control circuit 30
clamping circuit 100
operational amplifier 200
PWM control circuit 300
source current source 210
first source current source 211
second source current source 212
first switch 213
second switch 214
primary wire W1
secondary wire W2
auxiliary wire W3
input voltage detector 110
clamping voltage generator 120
clamper 130
connection switch S3
resistor R1 and R2

What is claimed is:
1. A power supply comprising:
a power switch;
a primary wire configured to receive an input voltage;
an auxiliary wire coupled electromagnetically with the primary wire; and
a switch control circuit configured to:
sense the input voltage during an input voltage detection period in a start-up period;

generate an input sense voltage corresponding to the sensed input voltage using a current supplied for clamping a voltage which is resistance-divided from the auxiliary voltage to a predetermined voltage;

determine a peak voltage by detecting a peak of the input sense voltage;

determine a clamping voltage in an inverse relationship with the peak voltage;

generate a comparison voltage according to an output;

clamp the comparison voltage to the clamping voltage during the start-up period; and control a switching operation of the power switch using a comparison voltage.

2. The power supply of claim 1, wherein the switch control circuit senses the input voltage using an auxiliary voltage of the auxiliary wire during an input voltage detection period in the start-up period.

3. The power supply of claim 1, wherein the switch control circuit further comprises:

an operational amplifier configured to generate the comparison voltage using a first source current during the start-up period; and a first source current source configured to supply the first source current.

4. The power supply of claim 3, wherein the first source current source supplies the first source current to the operational amplifier during a remaining period, excluding an input voltage detection period in the start-up period, and supplies the first source current to the operational amplifier during an increasing period in the input voltage detection period.

5. The power supply of claim 3, wherein the switch control circuit further comprises a second source current configured to supply a second source current to the operational amplifier in a normal state after termination of the start-up period.

6. A driving method of a power supply including a primary wire connected to an input voltage and a power switch connected to the primary wire, comprising:

controlling a switching operation of the power switch using a comparison voltage generated according to an output;

determining a clamping voltage by sensing the input voltage during a start-up period by sensing the input voltage, detecting a peak voltage of the sensed input voltage and determining the clamping voltage in an inverse relationship with the peak voltage; and clamping the comparison voltage to the clamping voltage during the start-up period, wherein the power supply further comprises an auxiliary wire coupled with the primary wire; and sensing the input voltage comprises generating an input sense voltage corresponding to the sensed input voltage using a current supplied to clamp a voltage which is resistance-divided from an auxiliary voltage of the auxiliary wire to a predetermined voltage during an input voltage detection period in the start-up period.

7. The driving method of the power supply of claim 6, wherein the detecting the peak voltage comprises determining the peak voltage by detecting a peak of the input sense voltage.

8. The driving method of the power supply of claim 6, further comprising generating the comparison voltage using a first source current during the start-up period.

9. The driving method of the power supply of claim 8, wherein the generating the comparison voltage comprises:

supplying the first source current to a capacitor during a remaining period, excluding the input voltage detection period in the start-up period; and supplying the first source current to the capacitor during an increasing period in the input voltage detection period.

10. A clamping circuit for clamping a comparison voltage determined according to an output of a power supply, comprising:

an input voltage detector configured to:

sense an input voltage of the power supply during a start-up period;

generate an input sense voltage corresponding to the sensed input voltage using a current supplied for clamping a voltage which is resistance-divided from the auxiliary voltage to a predetermined voltage; and determine a peak voltage by detecting a peak of the input sense voltage; and a clamping voltage generator configured to determine a clamping voltage in an inverse relationship with the peak voltage and to generate the clamping voltage, wherein the comparison voltage is clamped to the clamping voltage during a start-up period.

11. The clamping circuit of claim 10, wherein the input voltage detector senses the input voltage using an auxiliary voltage of an auxiliary wire electromagnetically coupled to a primary wire of the power supply during the start-up period.

12. The clamping circuit of claim 10, further comprising:

a connection switch configured to be turned on during the start-up period; and a clamper connected to the comparison voltage through the connection switch during the start-up period, and configured to clamp the comparison voltage to the clamping voltage.

* * * * *